United States Patent [19]

Kondo et al.

[11] Patent Number: 4,837,408
[45] Date of Patent: Jun. 6, 1989

[54] HIGH DENSITY MULTILAYER WIRING BOARD AND THE MANUFACTURING THEREOF

[75] Inventors: Kazuo Kondo; Asao Morikawa; Hiroshi Iwata, all of Aichi, Japan

[73] Assignee: NGK Spark Plug Co., Ltd., Aichi, Japan

[21] Appl. No.: 196,408

[22] Filed: May 20, 1988

[30] Foreign Application Priority Data

May 21, 1987 [JP] Japan ............................... 62-122486
May 26, 1987 [JP] Japan ............................... 62-129441

[51] Int. Cl.$^4$ ............................................. H05K 1/09
[52] U.S. Cl. .................... 174/68.5; 252/514; 264/61; 361/414
[58] Field of Search ............ 174/68.5; 361/414; 252/512, 514; 264/61

[56] References Cited

U.S. PATENT DOCUMENTS

| | | | |
|---|---|---|---|
| 3,293,501 | 12/1966 | Martin | 252/514 X |
| 3,776,769 | 12/1973 | Buck et al. | 252/514 X |
| 3,843,350 | 10/1974 | Larry | 252/514 X |
| 3,851,228 | 11/1974 | Sheard | 252/514 X |
| 4,072,771 | 2/1978 | Grier | 252/512 X |
| 4,109,377 | 8/1978 | Blazik | 174/68.5 X |
| 4,446,059 | 5/1984 | Eustice | 252/512 X |
| 4,705,917 | 11/1987 | Gates et al. | 174/52.4 |
| 4,756,848 | 7/1988 | Tieke et al. | 252/512 X |

FOREIGN PATENT DOCUMENTS 0092155  10/1983  European Pat. Off. ............ 174/257

Primary Examiner—R. R. Kucia
Attorney, Agent, or Firm—Sughrue, Mion, Zinn, Macpeak & Seas

[57] ABSTRACT

A multilayered wiring board comprising a plurality of green sheets of crystallizable glass which have a conductive pattern printed thereon. The green sheets are laminated together and sintered as a unit. The conductive composition used for the conductive pattern mainly comprises Cu or CuO with lesser amounts of $MnO_2$. According to two embodiments the conductive composition additionally contains (1) Pd and/or Pt or (2) $Ag_2O$ and $TiO_2$ or $TiH_2$. Thereby volume contraction due CuO reduction cancels out volume expansion due to Cu oxidation in the subsequent degreasing.

6 Claims, 1 Drawing Sheet

HIGH DENSITY MULTILAYER WIRING BOARD AND THE MANUFACTURING THEREOF

FIELD OF THE INVENTION

The present invention relates to a high density multilayer wiring board having high density wiring such as super multipin grid array IC packages and also relates to the manufacturing thereof. Particularly, the invention relates to a high density multilayer wiring board consisting of a low temperature fired ceramic on the surface of which is formed a metallized layer consisting of a low resistance conductive material with a low melting point, which can be formed by simultaneous firing with the said ceramics. Even more particularly, the invention relates to a high density multilayer wiring board having the metallized layer formed inside the through holes of the ceramic board and to the manufacturing thereof.

BACKGROUND OF THE INVENTION

Crystallized glass has a thermal expansion coefficient near to that of silicon and also has a low dielectric constant. It has the further advantage that it can be fired at low temperatures. Therefore, it has become of great interest for high density wiring boards for IC packages, multilayers boards, etc. Such boards consist of an insulating substrate comprising the above glass and conductive materials of low resistance metals having low melting points, such as silver, copper, etc. For example, Japanese Patent Application (OPI) No. 12899/80 (the term "OPI" used herein referrs to an unexamined published Japanese Patent Application) proposes a glass ceramic as such. According to this application, a so-called "green sheet" consists of glass particles which crystallize at temperatures lower than the melting point of copper. The green sheet is patterned on its surface by pattern-printing a conductive paste, is laminated to form a monolithic body, and the laminated body is then fired in a predetermined atmosphere.

The "green sheet" described herein referrs to a low-temperature sintered insulating ceramic material having a low dielectric constant and a thermal expansion coefficient near to that of silicon semiconductor chips. Such a green sheet is the molding disclosed in Japanese Patent Applicant (OPI) No. 92943/84, according to which a base composition contains 57 to 63 wt% $SiO_2$, 20 to 28 wt% $Al_2O_3$, 10 to 18 wt% $MgO$, and 2 to 6 wt% $ZnO$, to which is added 0.1 to 5 wt% of a crystalline glass composition of $B_2O_3$ and/or $P_2O_5$ as the frit. The mixture is molded and fired at low temperatures to give a crystallized glass body.

On the other hand, a copper or a copper oxide base metallizing composition which provides tight sealing of the conductive part is required for the paste forming the conductive patterns on the green sheet.

The above copper oxide base composition, however, is disadvantageous in that volume contraction occurs when $CuO$ is reduced to the conductive $Cu$ during heating in a reducing or an inert atmosphere. On the other hand volume expansion occurs in the copper base composition by oxidation of $Cu$ during degreasing in air. The above changes in volume are liable to generate cracks in ceramics and conductive parts.

In addition to the above contraction, when the through holes were filled with metallizing composition, openings would form due to the difference between the contraction coefficient of the $Cu$ and that of the through hole inside wall, or the openings may generate cracks leading to failure of circuit continuity.

Japanese patent application No. 294459/86 proposes a conductive paste composition comprising 80 wt% or higher (according to the copper component thereof) of copper or copper oxide and 12 wt% or lower of $MnO_2$ and/or 8 wt% of $Ag_2O$. However, the adhesion strength of the copper past on the uppermost of the multilayer board is 0.5 kg/mm². Therefore, improvement of the adhesion strength is required.

SUMMARY OF THE INVENTION

A first object of the present invention is to provide a high density multilayer wiring board using a highly airtight conductive material. A second object is to provide a high density multilayer wiring board having improved adhesion strength between the uppermost pattern on the wiring board and the conductive material.

The first embodiment of the invention is a high density multilayer wiring board wherein a conductive material containing by weight, 100 parts of base composition comprising 50 to 90% $CuO$ and 10 to 50% $Cu$ with addition of 20 to 80 parts of $Pd$ and/or $Pt$, and at least one of 10 parts or less of $MnO_2$, and 5 parts or less of $Ag_2O$. The conductive material is printed on the surface of a green sheet containing crystallizable glass, is laminated and sintered as a unit. The second embodiment of the invention is a high density multilayer wiring board using a conductive material containing by weight, 100 parts (as measured with respect to the $Cu$ composition thereof) of $Cu$ and/or $CuO$, 16 parts by weight or less of $MnO_2$, 10.5 parts or less of $Ag_2O$, and 4 parts by weight of $TiO_2$ and/or $TiH_2$. This conductive material is printed on the surface of a green sheet containing a crystallizable glass, laminated, and fired at the same time.

Figure 1:
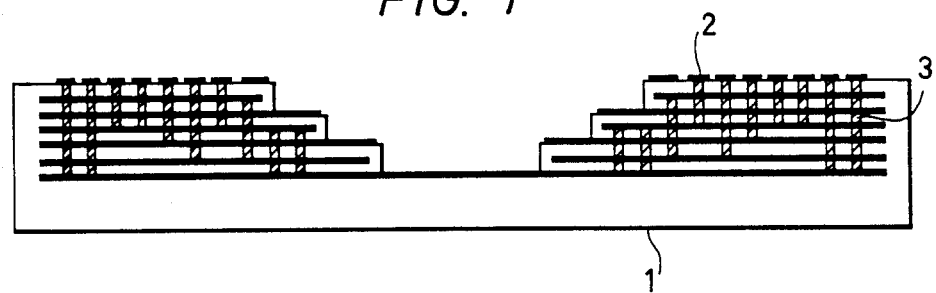
FIG. 1, is the cross section of the multilayer board prepared in an example of the present invention.

DETAILED DESCRIPTION OF THE INVENTION $Cu$ and $CuO$ are rendered conductive by heating with the ceramic green sheet in a reducing or in an inert atmosphere. The content ratio of $Cu$ to the $CuO$ is limited as above in order to suppress the total volume change by cancelling out the effects of volume contraction due to the $CuO$ reduction during the reduction process and the volume expansion due to the $Cu$ oxidation during the degreasing process.

$Pd$ and $Pt$ together with $Cu$ and $CuO$, maintain the conductivity required. Also, as they are nearly free from oxidation and reduction at high temperatures, they are further effective in loawering the volume change of the total conductive material. When the $Pd$ and $Pt$ content by weight is less than 20 parts for 100 parts of $Cu$, pores and cracks tend to segregate, and when the $Pd$ and $Pt$ content exceeds 80 parts, the electrical resistance increases and tends to be rather disadvantageous for wirings in which multiple superimposed through holes exist. $MnO_2$ increases wettability of the $Cu$ and the crystallized glass by reduction to $Mn_2O_3$, $MnO$, or $Mn$. When the $MnO_2$ content exceeds 12 parts by weight in the first embodiment and 16 parts by weight in the second, the sinterability of copper particles is suppressed, and brings about leakage damage of an increase of resistance. Therefore, the $MnO_2$ content is limited to be not higher than 12 parts by weight for the first embodiment and 16 parts by weight for the second. $Ag_2O$ is reduced to Ag in hydrogen at 100° C. and forms a liquid Cu-Ag alloy, the so-called silver solder, locally in the interface of copper particles to effect a dense sintering. When the $Ag_2O$ content exceeds 8 parts by weight in the first embodiment and 10.5 parts by weight in the second, the silver solder forms spheres and results in degradation of adhesion strength with the substrate. Therefore, the $Ag_2O$ content is restricted to be not higher than 8 parts by weight for the first embodiment and 10.5 parts by weight for the second. $MnO_2$ and $Ag_2O$ thus avoid formation of pores between the substrate and the conductor, pores inside the conductor, and increases air tightness.

Further, $TiO_2$ or $TiH_2$ used in the second embodiment diffuses from the metallized layer into the ceramic, and results in improved air tightness and adhesion strength. When the $TiO_2$ or $TiH_2$ content exceeds 4 parts by weight, the diffusion occurs in excess, and leads to decreasing insulation resistance and withstand voltage. Further, an excess $TiO_2$ or $TiH_2$ content causes a porous metallized layer and the conductor resistance increases to too high a value.

The present invention is further explained in detailed using some non-limiting examples as follows. The percentages and parts are in weight base if not otherwise stated.

EXAMPLE 1

ZnO, $MgCO_3$, $Al(OH)_3$, $SiO_2$, $H_3BO_3$, and $H_3PO_4$ were weighed and mixed using an autorotating pestle and mortar to give a composition of 4% ZnO, 13% MgO, 33% $Al_2O_3$, 58% $SiO_2$, 1% $B_2O_3$, and 1% $P_2O_5$. The mixture was melted at 1450° C. in an alumina crucible, thrown into water for quenching to glassify it, and ground to 2 $\mu$m average particle size in an alumina ball mill to obtain the frit.

The above frit was slurrified by adding organic binder and solvent, and a 0.6 mm thick green sheet was prepared by the doctor blade method.

CuO particles with average size of 1.5 $\mu$m, Cu particles of 15 $\mu$m, Pd of 3 $\mu$m, Pt of 3 $\mu$m, $MnO_2$ powder and $Ag_2O$ powder were mixed as shown in Table 1 and blended with organic binder and solvent to give a conductor paste.

TABLE 1

| Metallization paste | 100 pts. wt. in total | | Pd (pts) | Pt (pts) | $MnO_2$ (pts) | $Ag_2O$ (pts) |
|---|---|---|---|---|---|---|
| | CuO (%) | Cu (%) | | | | |
| No. 1 | 90 | 10 | 30 | — | 8 | 3 |
| No. 2 | 80 | 20 | — | 60 | 2 | 5 |

A pattern consisting of 40 bands 20 $\mu$m thick, 40 mm long, and 0.5 mm wide at 1-mm interval was formed by screen printing on the above surface of the green sheet with a conductor paste the same as that used above except that it was free from Pd and Pt.

300-$\mu$m diameter through holes were bore at 200 points of the above band pattern, in which conductor paste was filled. A similar band pattern was formed by screen printing to make a right angle with the above band pattern passing over the above through hole.

Six green sheets and a thick base sheet were laminated, clad together under heat, and cut into 50×50 mm pieces.

The cut laminate was heated by gradually increasing a temperature to 750° C. in air over 8 hours, and maintained at this temperature for 0.2 to 1.0 hours.

Then, the laminate was brought into a hydrogen atmosphere, heated from room temperature to 350° C. at the heating rate of 0.5° C./min., held at the temperature for 0.5 to 1.5 hours, and sintered at 950° C. under hydrogen atmosphere.

As is shown in FIG. 1, a multilayered board 1 was manufactured consisting of 7 insulating substrates on which the patterns provide circuit continuity by the through holes 3.

Air tightness was measured by detecting He gas leakage through the multilayered board 1 using a He detector, Type MS-17, manufactured by Vee Co., and both conductor pastes No. 1 and No. 2 gave values not higher than $1 \times 10^{-8}$ cc/std·sec.

EXAMPLES 2 TO 4

ZnO, $MgCO_3$, $Al(OH)_3$, $SiO_2$, $H_3BO_3$, and $H_3PO_4$, were weighed and mixed using an autorotating pestle and mortar to give a composition of 4% ZnO, 13% MgO, 33% $Al_2O_3$, 58% $SiO_2$, 1% $B_2O_3$, and 1% $P_2O_5$. The mixture was melted in an alumina crucible at 1450° C., thrown into water for quenching to glassify it, and ground in an alumina ball mill to 2 $\mu$m average particle size to obtain the frit.

The frit was then slurrified by adding and mixing with organic binders such as polyvinyl butyrol and dioctyl phthalate, and solvents such as perchloroethylene and butyl alcohol, to give a 0.6 mm thick green sheet.

A conductor paste was prepared using CuO with average particle size of 1.5 $\mu$m and by blending organic binder and solvent, with a composition as shown in Table 2, where, CuO is represented by its Cu component.

TABLE 2

| No. | Cu | $MnO_2$ | $Ag_2O$ | $TiO_2$ | $TiH_2$ |
|---|---|---|---|---|---|
| Comparative Example | 98.0 | 1.9 | 0.1 | | |
| Example 2 | 91.5 | 6.4 | 0.1 | 2.0 | |
| Example 3 | 97.5 | 1.9 | 0.1 | | 0.5 |
| Example 4 | 90.0 | 7.3 | 0.3 | | 2.4 |

A wiring pattern as the conductive layer was formed by screen printing a 20 $\mu$m thick conductive layer of the above conductor paste on the surface of the above green sheet.

300-$\mu$m diameter through holes were bore at 200 points of the above wiring pattern, in which the above conductor paste was filled. Similarly, wiring patterns were screen printed to make a right angle with the above wiring pattern at the through hole points. The conductor paste passed through the holes on the sheets to be laminated.

Six green sheets and a thick base sheet were laminated, cladded under heat, and cut into 50×50 mm pieces.

The cut laminate was heated to 750° C. in air, and maintained at the temperature for 0.2 to 1.0 hours.

Then, the laminate was brought into a hydrogen atmosphere, heated from room temperature to 350° C. at the rate of 0.5° C./min., maintained at the temperature for 0.5 to 1.5 hours, and fired at 950° C. under a hydrogen atmosphere.

As is shown in FIG. 1, a multilayer board 1 consists of 7 insulating substrates consisting of glass substrates on which (conductive) patterns 2 are printed and given circuit continuity with through holes 3 filled with conductive paste.

Figure 2:
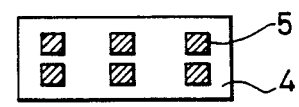
FIG. 2 is a planar view of the test piece used to measure the addition strength.

Air tightness measured on the multilayer board using a He-ditector was $1 \times 10^{-8}$ cc/std·sec. The adhesion strength was measured by manufacturing a crystallized glass substrate 4, illustrated in FIG. 2, having a pattern of 1.6 mm×1.6 mm square areas 5, soldering a 0.6-mm diameter copper wire to the square areas 5 with a 60Sn–40Pd solder, and then pulling the wire in the vertical direction.

The results are shown in Table 3.

TABLE 3

|  | Adhesion Strength (kg/mm$^2$) | Air Tightness (cc/std·sec.) |
| --- | --- | --- |
| Comparative Example | 0.5 | |
| Example 2 | 1.25 | $1 \times 10^{-8}$ |
| Example 3 | 1.00 | " |
| Example 4 | 0.90 | " |

The measured adhesion strength is the average for 3 tests.

Comparable strength to those obtained in the examples was also obtained when a 42 alloy metal, which comprises 58 percent Fe and 42 percent Ni, was pasted with a high temperature solder material on a Ni-plated metallized pattern which was prepared by applying a conductive paste on the substrate and firing the substrate.

While the invention has been described in detail and with reference to specific embodiment thereof, it will be apparent to one skilled in the art that various changes and modifications can be made therein without departing from the spirit and scope thereof.

What is claimed is:

1. A multilayered wiring board comprising a plurality of green sheets containing a crystallizable glass and having printed on surfaces thereof respective patterns of conductive composition, said plurality of printed green sheets being laminated together and then sintered, wherein said conductive composition contains by weight, 100 parts of a base composition containing 50 to 90% CuO and 10 to 50% Cu by weight, 20 to 80 parts of Pd and/or Pt, 10 parts or less of MnO$_2$, and 5 parts or less of Ag$_2$O.

2. A high density multilayer wiring board as in claim 1, wherein a conductive composition contains by weight, 100 parts in total of CuO and Cu, 20 to 80 parts of Pd and/or Pt, 10 parts or less of MnO$_2$, and 5 parts of less Ag$_2$O.

3. A multilayered wiring board comprising a plurality of green sheets containing a crystallizable glass and having printed on surfaces thereof respective patterns of a conductive composition, said plurality of printed green sheets being laminated together and then sintered, wherein said conductive composition contains by weight, 100 parts (according to Cu components thereof) of a base composition of Cu and/or CuO, 16 parts or less of MnO$_2$, 10.5 parts or less of Ag$_2$O, and 4 parts or less of TiO$_2$ or TiH$_2$.

4. A high density multilayer wired board as in claim 3, wherein a conductive composition contains by weight, 100 parts in total of CuO and Cu, 16 parts or less of MnO$_2$, 10.5 parts or less of Ag$_2$O, and 4 parts or less of TiO$_2$ or TiH$_2$.

5. A method of forming a multilayered wiring board comprising the steps of:
   printing on at least one respective surface of a plurality of green sheets containing a crystallizable glass a respective pattern formed of a conductive material;
   laminating together said printed green sheets; and
   sintering said laminated green sheets;
   wherein said conductive composition contains by weight, 100 parts of a base composition containing 50 to 90% CuO and 10 to 50% Cu by weight, 20 to 80 parts of Pd and/or Pt, 10 parts or less of MnO$_2$, and 5 parts or less of Ag$_2$O.

6. A method of forming a multilayered wiring board comprising the steps of:
   printing on at least one respective surface of a plurality of green sheets containing a crystallizable glass a respective pattern formed of a conductive material;
   laminating together said printed green sheets; and
   sintering said laminated green sheets;
   wherein said conductive composition contains by weight, 100 parts (according to Cu components thereof) of a base composition of Cu and/or CuO, 16 parts or less of MnO$_2$, 10.5 parts or less or Ag$_2$O, and 4 parts or less of TiO$_2$ or TiH$_2$.

* * * * *